United States Patent
Vig et al.

(10) Patent No.: US 8,390,354 B2
(45) Date of Patent: Mar. 5, 2013

(54) DELAY CONFIGURABLE DEVICE AND METHODS THEREOF

(75) Inventors: Nitin Vig, Austin, TX (US); Arnab K. Mitra, Los Angeles, CA (US)

(73) Assignee: Freescale Semiconductor, Inc., Austin, TX (US)

( * ) Notice: Subject to any disclaimer, the term of this patent is extended or adjusted under 35 U.S.C. 154(b) by 1465 days.

(21) Appl. No.: 11/435,917

(22) Filed: May 17, 2006

(65) Prior Publication Data

US 2007/0268053 A1 Nov. 22, 2007

(51) Int. Cl.
*H03K 3/289* (2006.01)
(52) U.S. Cl. .......................... 327/202; 327/208
(58) Field of Classification Search .................. 327/202, 327/203, 199, 208–213
See application file for complete search history.

(56) References Cited

U.S. PATENT DOCUMENTS

| | | | |
|---|---|---|---|
| 5,525,921 A * | 6/1996 | Callahan | 327/144 |
| 6,452,433 B1 | 9/2002 | Chang et al. | |
| 6,661,717 B1 | 12/2003 | Gomm et al. | |
| 2001/0007144 A1 | 7/2001 | Terazawa | |
| 2003/0051222 A1 | 3/2003 | Williams et al. | |
| 2003/0200380 A1* | 10/2003 | Lee et al. | 711/103 |
| 2004/0130367 A1 | 7/2004 | Swarbrick et al. | |
| 2005/0050496 A1 | 3/2005 | Kovacs et al. | |

* cited by examiner

*Primary Examiner* — Lincoln Donovan
*Assistant Examiner* — Diana J Cheng

(57) ABSTRACT

A device and associated method to reduce hold-time violations are disclosed. The device includes a latch module with a selectable delay. The latch module includes a control input to select the delay through the latch. In one embodiment, the delay of the latch is the time between when a latching edge of a clock signal is experienced by the latch until data changes at the output of the latch. In the event of a hold-time violation at latches that are downstream of other latches, a longer delay can be selected at an upstream latch to provide a slower delay path for data provided to the downstream latch violating the hold-time. By providing a slower delay path, the data being latched at the downstream latch will not change as quickly after a latching signal is received, and therefore the possibility of a hold-time violation is reduced.

20 Claims, 4 Drawing Sheets

DELAY CONFIGURABLE DEVICE AND METHODS THEREOF

FIELD OF THE DISCLOSURE

The present disclosure relates to digital electronic devices and more particularly to digital latches.

BACKGROUND

Digital devices typically employ a large number of latch elements such as a flip-flops. These latch elements store data that is present at an input in response to a latching signal. For example, a rising-edge triggered latch will store the data that is present at its input during the rising transition of the latching signal. This data propagates to the output of the device where it is held until a subsequent rising transition of the latching signal is detected.

Latch elements have set-up time and hold-time requirements. Set-up time refers to the amount of time data must be stable at the input of the latch element prior to a latching edge of the latching signal in order for the data to be properly latched. In contrast, a hold-time requirement refers to the amount of time data at the input of a latch or flip-flop should remain stable after a latching edge in order for the data to latch properly. If the data at the input does not remain stable for the requisite time, a hold-time violation occurs and the valve stored at the latch element can be indeterminate.

In integrated circuit devices, the hold-time for a particular latch element of the device can be affected by variations in the process used to create the device as well as by the operating conditions of the device. Accordingly, it can be difficult to predict the occurrence of hold-time violations prior to forming the integrated circuit device. However, because hold-time violations are independent of clock frequency, unlike set-up time violations, the occurrence of hold-time violations is usually addressed by design or manufacturing changes that require reforming the integrated circuit, result in undesirable delay and expense.

Therefore, it is desirable to provide a device and method to address hold-time violations.

DESCRIPTION OF THE DRAWINGS

A device and associated method to reduce hold-time violations are disclosed. The device includes a latch module with a selectable delay. The latch module includes a control input to select the delay through the latch. In one embodiment, the delay of the latch is the time between when a latching edge of a clock signal is experienced by the latch until data changes at the output of the latch. In the event of a hold-time violation at latches that are downstream of other latches, a longer delay can be selected at an upstream latch to provide a slower delay path for data provided to the downstream latch violating the hold-time. By providing a slower delay path, the data being latched at the downstream latch will not change as quickly after a latching signal is received, and therefore the possibility of a hold-time violation is reduced.

Figure 1:
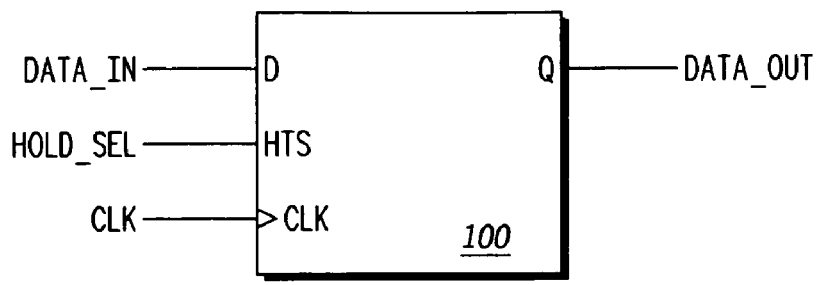
FIG. 1 is a block diagram of a particular embodiment of a latch element including a selectable delay to address hold-time violations.

Referring to FIG. 1, a latch element 100 is illustrated. The latch element 100 includes a first input (D) to receive a data signal (DATA_IN), a second input (HTS) to receive a hold-time select signal (HOLD_SEL), and a third input (CK) to receive a clock signal (CLK). The latch element 100 also includes an output (Q) to provide a data signal (DATA_OUT). The latch element 100 is specifically illustrated to be a D-type flip-flop, though other types of latch elements are anticipated herein. For example, J-K flip-flops, SR flip-flops, and other latches can also be used.

During operation, the latch element 100 receives the signal DATA_IN and the signal CLK. In response to a latching edge of the signal CLK, the logic value of DATA_IN is latched by the latch element 100 and provided at the output Q as the signal DATA_OUT. It will be appreciated, however, there is a delay between the latching edge of the signal CLK and when the latched data is provided at the output Q. Generally, this delay is due to the propagation delay through logic elements of latch element 100. In accordance with the present disclosure, this delay is variable based on the signal HOLD_SEL. For example, when the signal HOLD_SEL is in a first state, a first delay through the latch 100 is selected, and when the signal HOLD_SEL is in a second state a second delay through latch 100 is selected.

In a particular embodiment, the signal HOLD_SEL is used to change the delay of the latch element 100 in response to detection of a hold-time violation in a latch element that is downstream from the latch element 100. For example, after detection of a hold-time violation, the signal HOLD_SEL is asserted to select a longer delay through the latch element 100, thereby ensuring that DATA_OUT does not change as quickly in response to a latching edge of the signal CLK. Because the data at the output Q is held for a longer period of time relative to the latching edge, hold-time violations in downstream latch elements using the same latching edge are reduced.

Figure 2:
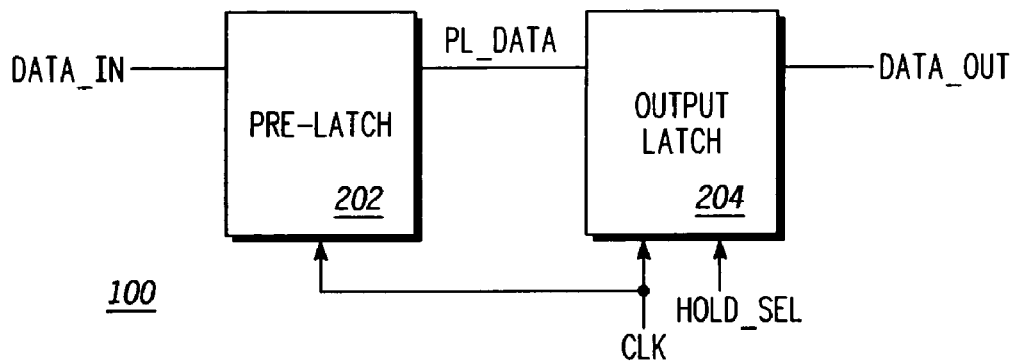
FIG. 2 is a more detailed block diagram of a particular embodiment of the latch element of FIG. 1.

Referring to FIG. 2, a particular embodiment of the latch element 100 is illustrated. The latch element 100 includes a pre-latch stage 202 including an input to receive the signal DATA_IN, an input to receive the signal CLK, and an output to provide the signal PL_DATA. The latch element 100 further includes an output latch stage 204 having an input to receive the signal PL_DATA, an input to receive the signal CLK, and input to receive the signal HOLD_SEL. In addition, the output latch stage 204 includes an output to provide the signal DATA_OUT.

During operation, the pre-latch stage 202 and the output latch stage 204 are configured so that the latch element 100 is an edge triggered latch, such as a D-type flip-flop. In response to assertion of the signal CLK, the pre-latch stage 202 latches the value of DATA_IN and provides this value at the output signal PL_DATA. In addition, when the signal CLK is asserted, the output latch 204 is transparent, thereby allowing signals at its input to be provided at DATA_OUT. In response to deassertion of the signal CLK, the output latch stage latches the value at PL_DATA and continues to provide this value as signal DATA_OUT. In this manner, the latch 100 operates as a positive edge triggered flip-flop. The latch 100 differs from a typical latch, however, in that the output latch stage 204 has a selectable delay. That is, the delay between receiving a latching edge of the signal CLK and changing the value of the signal DATA_OUT to match the value of DATA_IN is selectable, based on the signal HOLD_SEL.

Figure 3:
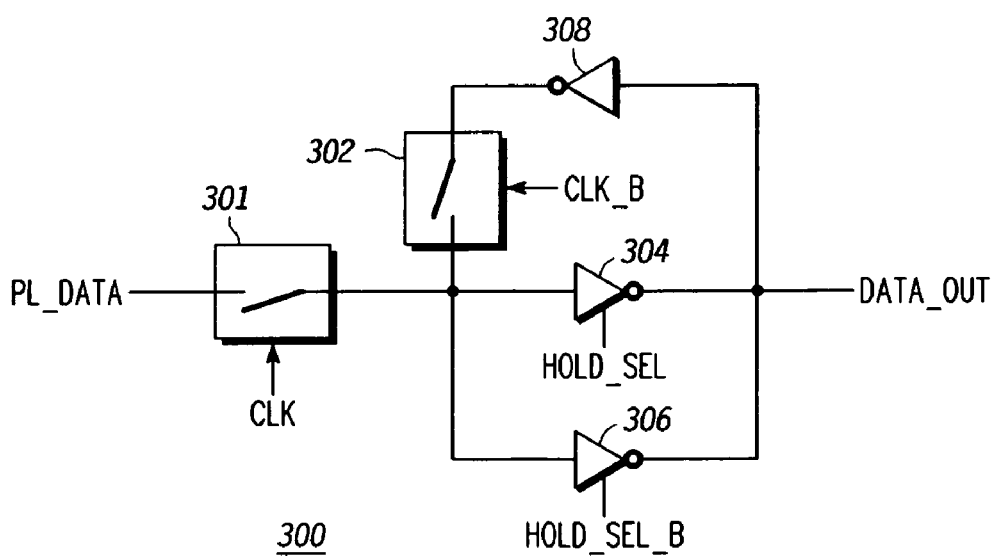
FIG. 3 is more detailed block diagram of a particular embodiment of the output latch stage of the latch element of FIG. 2.

Referring to FIG. 3, a particular embodiment of an output latch stage 300 that can be implemented as output latch stage 204 is illustrated. The output latch stage 300 includes a first switch 301 including a data input to receive the signal PL_DATA, a data output, and a control input to receive the clock signal CLK. The output latch stage 300 also includes a first tristateable inverter 304 having a data input connected to the output of the first switch 301, a control input to receive the signal HOLD_SEL and an output to provide the signal DATA_OUT. The output latch stage 300 further includes a second tristateable inverter 306 having a data input connected to the output of the first switch 301, a control input to receive a signal HOLD_SEL_B that is complementary to the signal HOLD_SEL, and an output connected to the output of the first tristateable inverter 304. In addition, the output latch stage 300 includes an inverter 308 having an input connected to the output of the first tristateable inverter 304 and an output. Further, the output latch stage 300 includes a second switch 302. The switch 302 includes a data input connected to the output of the third inverter 308, a data output coupled to the inputs of the first tristateable inverter 304, and a control input to receive a signal CLK_B.

During operation, the switch 301 receives the clock signal CLK and the switch 302 receives the complementary clock signal CLK_B. Accordingly, in response to deassertion of the signal CLK, the switch 301 is opened and the switch 302 is closed, allowing the value of the signal PL_DATA to be latched by the arrangement of the inverter 308 and either the first inverter 304 or the second inverter 306, depending on the value of HOLD_SEL and HOLD_SEL_B signals.

The operations of the first tristateable inverter 304 and the second tristateable inverter 306 are controlled by the signals HOLD_SEL and HOLD_SEL_B, respectively. The signal HOLD_SEL_B is the complement of the signal HOLD_SEL. This control signal enables one of tristateable inverter 304 or tristateable inverter 306, while disabling the other inverter by placing its output in a tri-state mode. The inverter that is not placed in tri-state drives the output signal DATA_OUT and operates in conjunction with the inverter 308 to latch the value of PL_DATA.

The first tristateable inverter 304 and the second tristateable inverter 306 are designed to have different delay characteristics. Accordingly, the signal path including the tristateable inverter 304 has a different delay than the signal path including the tristateable inverter 306. In a particular embodiment, the second inverter 306 has a longer propagation delay than the inverter 304, so that a change in the value of PL_DATA, when latched, will propagate to the output of the inverter 304 more quickly than it will propagate to the output of the second inverter 306.

Therefore, based upon a value of the signal HOLD_SEL, the delay of the output latch stage 300 can be selected. By selecting a value of HOLD_SEL to increase the delay of the output latch stage 300, the signal DATA_OUT responds more slowly to changes in the signal PL_DATA, thereby allowing an additional timing margin to address a hold-time violation downstream latch element.

Figure 4:
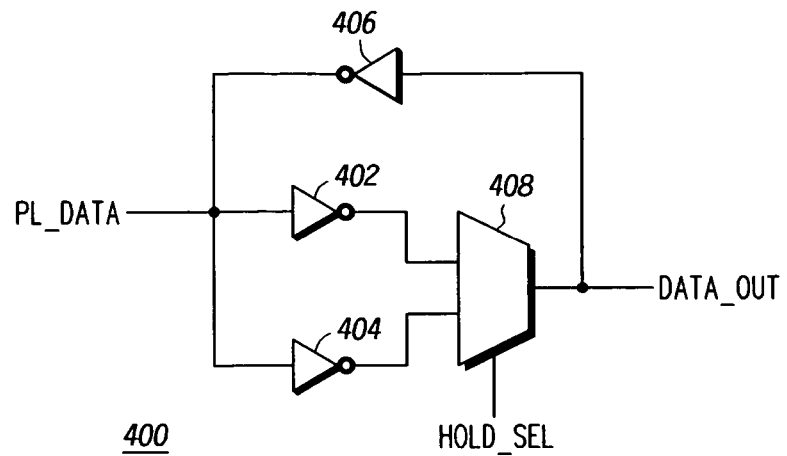
FIG. 4 is a block diagram of an alternative particular embodiment of the output latch of FIG. 2.

Referring to FIG. 4, another embodiment of an output latch stage 400 is illustrated. The output latch stage depicted in FIG. 4 is logically equivalent to the output latch stage illustrated in FIG. 3. As illustrated, the output latch stage 400 includes a first inverter 402 having an input to receive the signal PL_DATA and an output; a second inverter 404 having an input to receive the signal PL_DATA and an output; a multiplexer 408 having a first data input connected to the output of inverter 402, a second data input connected to the output of inverter 404, a select input to receive a control signal HOLD_SEL, and an output to provide the signal DATA_OUT; a third inverter 406 having an input connected to the output of the multiplexer and an output connected to the inputs of the first inverter 402.

During operation, based on the state of the control signal HOLD_SEL, the multiplexer 408 selects the output of one of the first inverter 402 or the second inverter 404 and provides a signal at the selected output at output signal DATA_OUT. This selection places either the first inverter 402 or the second inverter 404 in a configuration with the third inverter 406 to latch the data at PL_DATA.

The first inverter 402 and the second inverter 404 have different delay characteristics. Accordingly, the signal HOLD_SEL may be used to address hold-time violations downstream of the latch element by providing additional hold-time.

Figure 5:
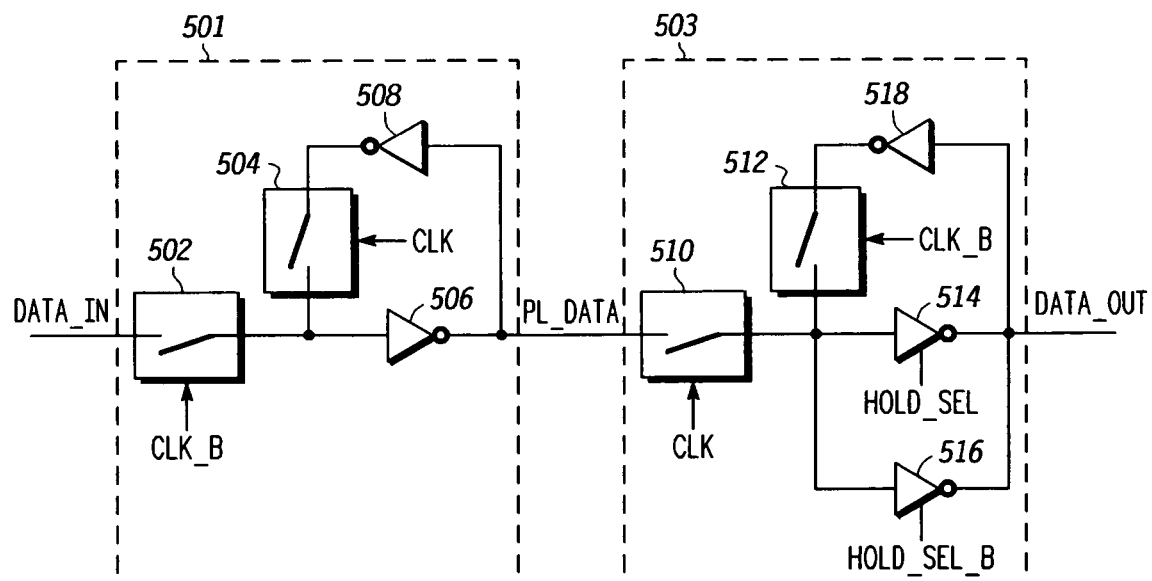
FIG. 5 is a more detailed block diagram of a particular embodiment of the pre-latch and output latch of FIG. 2.

Referring to FIG. 5, an embodiment of a latch element 500 is illustrated. The latch element 500 includes a pre-latch stage 501 and an output stage 503. The output stage 503 includes tristateable inverters 514 and 516, inverter 518, and switches 510 and 512. These devices are configured, and operate, in the same manner as the devices of output stage 300 of FIG. 3 as previously described.

The pre-latch stage 501 includes a first switch 502 having a data input to receive the signal DATA_IN, a control input to receive the clock signal CLK_B and an output. The pre-latch stage further includes a first inverter 506 having a first input connected to the output of the switch 502 and an output to provide the signal PL_DATA. The pre-latch stage 501 further includes a second inverter 508 including an input connected to the output of the first inverter 506 and an output. In addition, the pre-latch stage 501 includes a second switch 504. The second switch 504 includes a data input connected to the output of the second inverter 508, an output connected to the input of the first inverter 506, and a control input to receive the signal CLK.

During operation, the clock signals CLK and CLK_B (the complement of CLK) are used to control the latching function of the latch element 500. In response to an assertion of the clock signal CLK, the second switch 504 is closed while the first switch 502 is opened allowing the value of DATA_IN at the edge of the clock signal to be latched by the arrangement pre-latch stage 501. Simultaneous with the latching of data at pre-latch stage 501, the switch 510 of output stage 503 closes allowing signal PL_DATA to propagate to output DATA_OUT. In response to deassertion of the clock signal CLK, the data at PL_DATA latched by the pre-latch stage 501 is latched at the output stage 503. Accordingly, under the illustrated configuration, the latch element 500 is an edge-triggered flip-flop.

Further, although the latch element 500 has been described as latching on the rising edge of the clock signal CLK, one of skill in the art will appreciate that the latch element 500 could be configured to latch on the falling edge of the signal without departing from the scope of the techniques disclosed herein.

Figure 6:
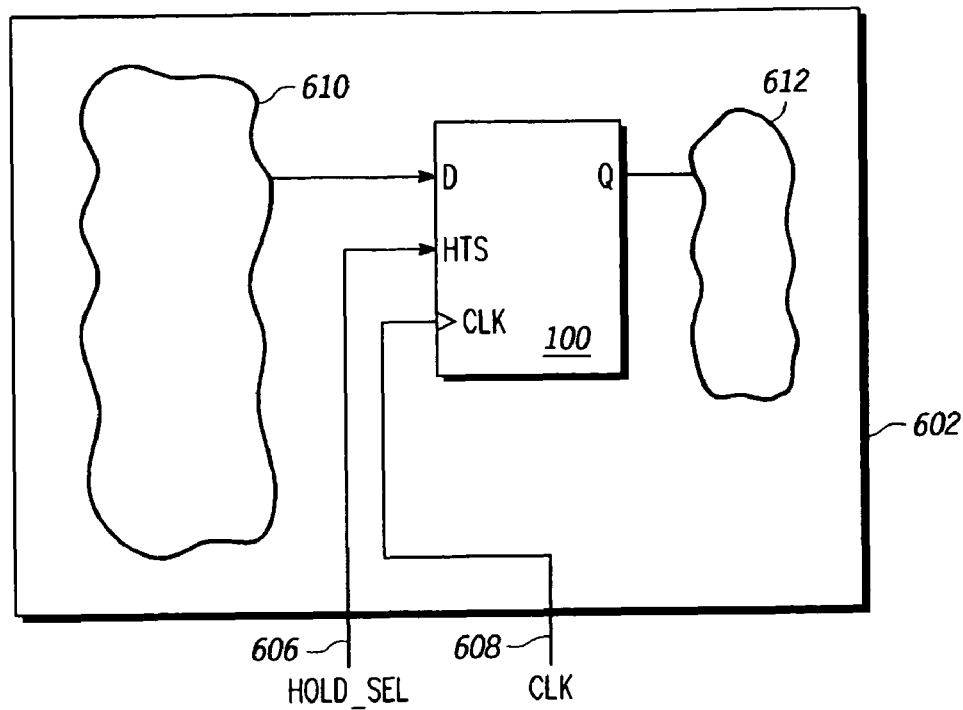
FIG. 6 is a block diagram of a particular embodiment of a system on a chip (SOC) incorporating the latch element of FIG. 1.

Referring to FIG. 6, a particular embodiment of a device 602 incorporating the latch element 100 of FIG. 1 is illustrated. The device 602 may be an integrated circuit system on a chip (SOC), a board level circuit, a product containing an SOC, or other device. The device 602 includes a number of input/output connections, including a first input/output connection 606 connected to the input of the latch element 100 labeled HTS. The input output connections may be input connections, output connections, or bi-directional connections. The first input/output connection 606 receives the signal HOLD_SEL. The device 602 further includes a second input/output connection 608 connected to the CK input of the latch element 100. The second input/output connection 608 receives the clock signal CLK. The device 602 further includes a first logic module 610 connected to the input D of the latch element 100 and a second logic module 612 connected to the output Q of the latch element 100. The logic modules 610 and 612 are collections of logic elements that can include combinatorial logic elements, and sequential elements, such as latch elements.

During operation, the clock signal CLK is used to control the latching of data at the latch element 100 and other latch elements of logic module 610 and 612. In response to an edge of the clock signal CLK, the latch element 100 latches the data that is provided by the first logic module 610 at its input D. This latched data is provided to the second logic module 612 at the output Q. The state of the signal HOLD_SEL controls the propagation delay through the latch element 100. Accordingly, the signal HOLD_SEL can be used to address hold-time violations in the latch elements of the second logic module 612.

For example, the device 602 may be tested using a fastest propagation delay through latch 100, and other instances of latches using the disclosed variable delay technique, to determine if there are any hold-time violations in device 602. If a hold-time violation is detected, the signal HOLD_SEL may be controlled so that the propagation delay of the latch element 100, and other latch elements is increased, thereby allowing additional hold-time for downstream latches. In the embodiment illustrated in FIG. 6, the signal HOLD_SEL is controlled external to the device 602 and applied via the input/output connection 606. Accordingly, the device 602 may be placed in a test environment, such as a hardware tester, allowing the signal HOLD_SEL to be controlled by the tester to detected hold-time violations. In addition, in a particular embodiment, the value of the signal HOLD_SEL can be permanently latched at a latch (non illustrated) during a start up of the device 602 in response to detection of a hold-time violation.

Figure 7:
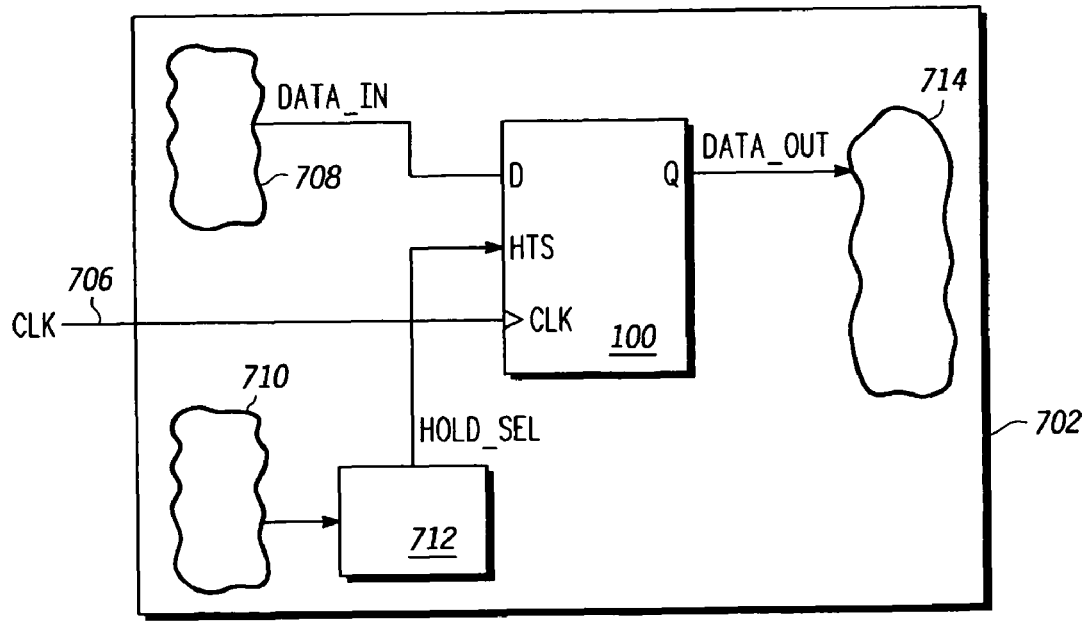
FIG. 7 is a block diagram of an alternative particular embodiment of an SOC incorporating the latch element of FIG. 1.

Referring to FIG. 7, a particular embodiment of a device 702 incorporating the latch element 100 of FIG. 1 is illustrated. The device 702 may be an integrated circuit system on a chip (SOC), a board level device, a device incorporating an SOC, or other device. The device 702 includes a number of input/output connections, including an input/output connection 706 connected to the CK input of the latch element 100. The input/output connection 706 receives the clock signal CLK. The device 702 further includes a first logic module 708 connected to the input D of the latch element 100 and a second logic module 714 connected to the output Q of the latch element 100. In addition, the device 702 includes a third logic module 710 connected to an input of a hold-time control module 712. The hold-time control module 712 includes an output connected to the HTS input of the latch element 100, and provides the signal HOLD_SEL to the latch element. The logic modules 708, 710 and 714 are collections of logic elements that can include combinatorial logic elements and latch elements.

During operation, the hold-time control module 712 controls the delay of data through the latch element 100 based on a state of HOLD_SEL. In a particular embodiment, the third logic module 710 detects hold-time violations in the latch elements of the second logic module 714 or is controlled by user input, and in response instructs the hold-time control module 712 to increase the delay of the latch element 100. The hold-time control module 712 places the signal HOLD_SEL in the appropriate state to increase the delay of the latch element 100. This increase in the delay ensures that the propagation delay of latch 100 will be increased, thereby addressing the hold-time violation.

Figure 8:
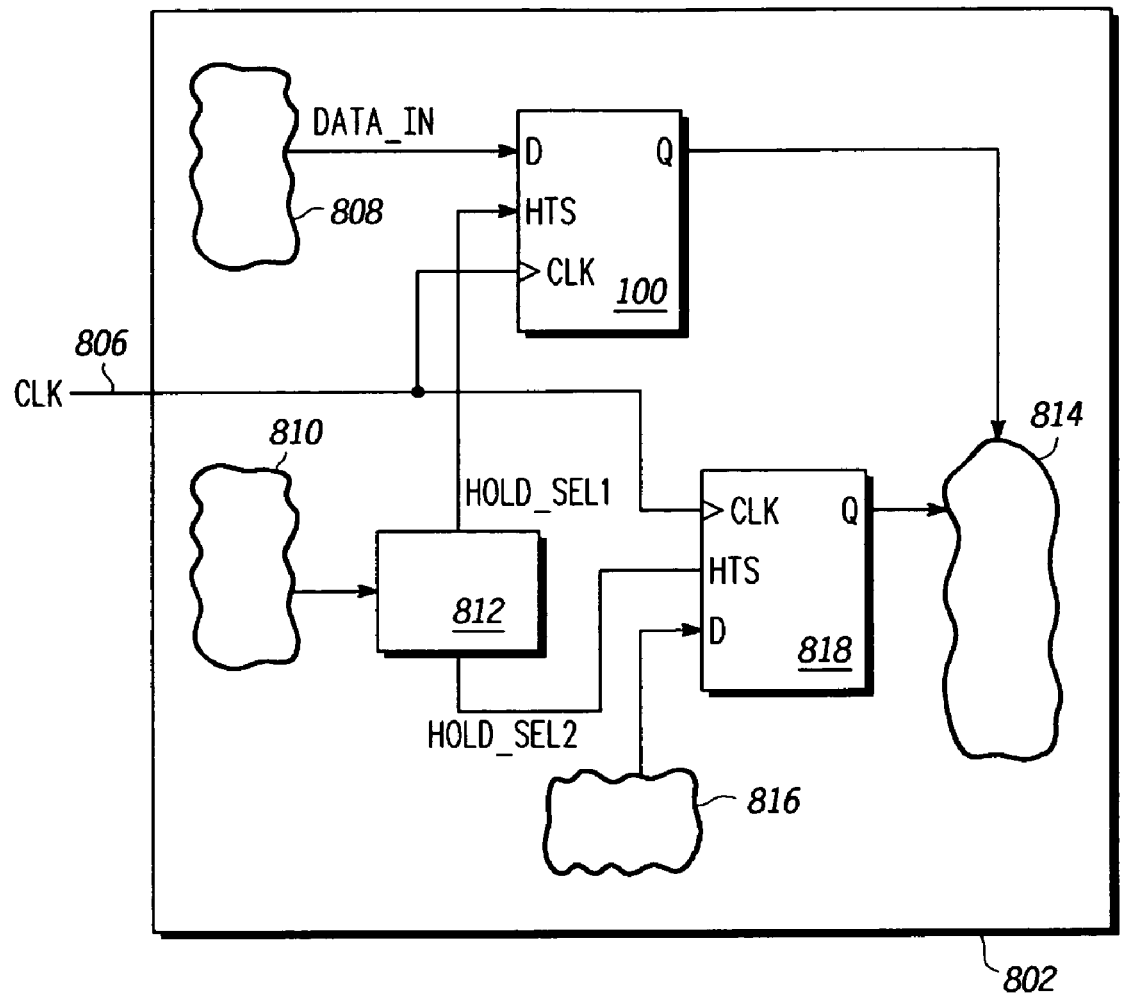
FIG. 8 is a block diagram of another alternative particular embodiment of an SOC incorporating the latch element of FIG. 1.

Referring to FIG. 8, a particular embodiment of a device 802 incorporating the latch element 100 of FIG. 1 is illustrated. The device 802 includes a number of input/output connections, including an input/output connection 806 connected to the CK input of the first latch element 100 and the CK input of a second latch element 818. The input/output connection receives the clock signal CLK. The device 802 further includes a first logic module 808 connected to the input D of the first latch element 100 and a second logic module 814 connected to the output Q of the first latch element 100. In addition, the device 802 includes a third logic module 810 connected to an input of a hold-time control module 812. The hold-time control module 812 includes an output connected to the HTS input of the first latch element 100 and the HTS input of the second latch element 818. The hold-time control module 812 provides a first control signal HOLD_SEL1 to the first latch element 100 and provides a second control signal (HOLD_SEL2) to the second latch element 818. The hold-time control module 812 can include one or more storage locations to control the state of the control signals HOLD_SEL1 and HOLD_SEL2. In addition, the device 802 includes a fourth logic module 816 connected to a data input (D) of the second latch element 818. The logic modules 808, 810 and 814 are collections of logic elements, including combinatorial logic elements. The logic modules may also contain latch elements.

During operation, the hold-time control module 812 controls the delays of the latch elements 100 and 818 via the control signals HOLD_SEL1 and HOLD_SEL2, respectively. The control signals are independent of each other, so that the delays of the latch elements 100 and 814 can be controlled independently. Accordingly, the hold-time control module can address hold-time violations in the logic module 814.

For example, a hold-time violation that occurs in the second logic module 814 may be the result of rapid changes in the output of the first logic module 808 or the fourth logic module 816. The occurrence of the hold-time violation can be recorded in one or more of the storage locations, such as a set of status flags, of the hold-time control module 812. The state of the control signals HOLD_SEL1 and HOLD_SEL2 can be based on the state of the status flags. In another particular embodiment, the control signals HOLD_SEL1 and HOLD_SEL2 can be received via input/output connections of the device 802. The control signals HOLD_SEL1 and HOLD_SEL2 can also be based on a common signal received via an input/output connection of the device 802.

Accordingly, the hold-time control module 812 can control the delay of the first latch element 100 to address the hold-time violation. If the hold-time violation persists, this can indicate that the hold-time violation is occurring due to rapid changes in the output of the fourth logic module 816. In response, the hold-time control module 812 can increase the delay of the second logic element 818, in an attempt to remedy the hold-time violation.

Thus, the device 802 is capable of addressing hold-time violations in one logic module without affecting the delay in the signal path of a second logic module. This can allow the unaffected logic module to operate under normal conditions after the hold-time violation is corrected.

Although the embodiments set forth herein have been described as using inverter elements, one of skill in the art will appreciate that other components can be used to provide a selectable delay, such as other logic elements, capacitive elements, or other appropriate element.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. Accordingly, the present disclosure is not intended to be limited to the specific form set forth herein, but on the contrary, it is intended to cover such alternatives, modifications, and equivalents, as can be reasonably included within the spirit and scope of the disclosure. For example, the signal HOLD_SEL is referred to as a signal having a binary state. It will be appreciated that the signal HOLD_SEL may be implemented using a bus having a binary value. For example, in a particular embodiment, the signal HOLD_SEL may be represented by a two bit binary number that determines an individual delay for up to four latch elements.

What is claimed is:

1. A method, comprising:
    receiving a first control signal at a first latch device;
    selecting a first delay through the first latch device for signals at an input of the first latch device in response to the first control signal being at a first state; and
    selecting a second delay through the first latch device for signals at the input of the first latch device in response to the first control signal being at a second state.

2. The method of claim 1, further comprising:
    providing the first control signal having the first state in response to detecting a hold-time violation at a second latch device.

3. The method of claim 2, wherein the first delay is longer than the second delay, and wherein the hold-time violation at the second latch device is in response to a signal from the first latch.

4. The method of claim 2, wherein the first latch device is an edge triggered latch.

5. The method of claim 1, wherein the first control signal is received via an input/output connection of an integrated circuit system-on-a-chip (SOC) that comprises the first latch device.

6. The method of claim 1, wherein the first control signal is based on an internal storage location of an integrated circuit system-on-a-chip (SOC) that comprises the first latch device.

7. The method of claim 1, further comprising:
    receiving a second control signal at a second latch device;
    selecting a third delay through the second latch device for signals at an input of the second latch device in response to the second control signal being at the first state; and
    selecting a fourth delay through the second device for signals at the input of the second latch device in response to the second control signal being at the second state.

8. The method of claim 7, wherein the first control signal is received via a first input/output connection of a system-on-a-chip (SOC) and the second control signal is received via a second input/output connection of the SOC.

9. The method of claim 7, wherein the first control signal and the second control signal are based on a common signal received via an input/output connection of the SOC.

10. The method of claim 7, wherein the first control signal and the second control signal are based on different internal storage locations of a system-on-a-chip (SOC), the SOC comprising the first latch device.

11. The method of claim 1, wherein the second delay is based on a delay of a second signal path of the first latch device.

12. The method of claim 11, wherein the first delay is based on a delay of a first signal path of the first latch device.

13. The method of claim 1, wherein the first delay is based on a delay of a first inverter and the second delay is based on a delay of a second inverter.

14. An apparatus, comprising:
    a first latch having a data input, a data output, a delay select input, and a delay select module comprising a first signal path through the latch to be selected responsive to a first delay select signal being received at the delay select input having a first state, and a second signal path through the latch to be selected responsive to the first delay select signal having a second state.

15. The apparatus of claim 14, further comprising:
    a second latch having a data input coupled to the data output of the first latch, a data output, a delay select input to receive the first delay select signal, and a delay select module comprising a third signal path to be selected responsive to the first delay select signal having the first state and a fourth signal path to be selected responsive to the first delay select signal having the second state.

16. The apparatus of claim 15, wherein the first delay select signal is received via a first external pin of a system on a chip (SOC), and the second delay select signal is received via a second external pin of the SOC, the SOC comprising the first latch.

17. The apparatus of claim 15, wherein the first delay select signal is based on an internal storage location of a system on a chip (SOC), the SOC comprising the first latch.

18. The apparatus of claim 14, further comprising:
    a second latch having a data input coupled to the data output of the first latch, a data output, a delay select input to receive a second delay select signal; and a delay select module comprising a third signal path to be selected responsive to the second delay select signal having the first state and a fourth signal path to be selected responsive to the second delay select signal having the second state.

19. The device of claim 14, wherein the first latch is an edge-triggered flip-flop.

20. The device of claim 14, wherein the first signal path includes a first inverter having a first delay and the second signal path includes a second inverter having a second delay.

* * * * *